US012796088B2

(12) United States Patent
Yang

(10) Patent No.: US 12,796,088 B2
(45) Date of Patent: Nov. 10, 2026

(54) DISPLAY PANEL AND ELECTRONIC DEVICE

(71) Applicant: Shenzhen China Star Optoelectronics Semiconductor Display Technology Co., Ltd., Shenzhen (CN)

(72) Inventor: Chunliu Yang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 1200 days.

(21) Appl. No.: 17/781,011

(22) PCT Filed: May 20, 2022

(86) PCT No.: PCT/CN2022/094149
§ 371 (c)(1),
(2) Date: Nov. 16, 2023

(87) PCT Pub. No.: WO2023/216306
PCT Pub. Date: Nov. 16, 2023

(65) Prior Publication Data

US 2024/0162249 A1 May 16, 2024

(30) Foreign Application Priority Data

May 11, 2022 (CN) ........................ 202210514984.X

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/451* (2025.01)

(58) Field of Classification Search
CPC .... H10D 86/60; H10D 86/451; H10D 86/441; H10D 86/443
See application file for complete search history.

(56) References Cited

U.S. PATENT DOCUMENTS

| | | | | |
|---|---|---|---|---|
| 2015/0337245 | A1* | 11/2015 | Hayama | C11D 3/361 510/175 |
| 2016/0365367 | A1* | 12/2016 | Kimura | H10D 86/423 |
| 2020/0066826 | A1 | 2/2020 | Kim | |

FOREIGN PATENT DOCUMENTS

| | | |
|---|---|---|
| CN | 1697575 | 11/2005 |
| CN | 101771072 | 7/2010 |

(Continued)

OTHER PUBLICATIONS

International Search Report and the Written Opinion Dated Nov. 25, 2022 From the International Searching Authority Re. Application No. PCT/CN2022/094149 and Its Translation Into English. (15 Pages).

*Primary Examiner* — Mohammed R Alam

(57) ABSTRACT

A display panel and an electronic device are provided. The display panel includes a substrate and a composite metal layer, and the composite metal layer includes a barrier layer and a main body layer. By reducing the potential difference between the main layer and the barrier layer, a gap between the main layer and the barrier layer can be reduced. In this way, the problem of hollowing out the barrier layer in the composite metal layer is alleviated, the problem of defective lines or black screen of the display panel is prevented, and the yield of the display panel is improved.

16 Claims, 7 Drawing Sheets

(56) References Cited

FOREIGN PATENT DOCUMENTS

| | | |
|---|---|---|
| CN | 111244034 | 6/2020 |
| CN | 113725279 | 11/2021 |

* cited by examiner

DISPLAY PANEL AND ELECTRONIC DEVICE

RELATED APPLICATIONS

This application is a National Phase of PCT Patent Application No. PCT/CN2022/094149 having International filing date of May 20, 2022, which claims the benefit of priority of Chinese Patent Application No. 202210514984.X filed on May 11, 2022. The contents of the above applications are all incorporated by reference as if fully set forth herein in their entirety.

FIELD AND BACKGROUND OF THE INVENTION

The present invention relates to a field of display technology, and particularly relates to a display panel and an electronic device.

In currently used thin film transistors, a common film structure of a metal film layer is a Cu/Mo stack structure or a Cu/MoNb stack structure.

During a process of etching a Cu/Mo stack structure, due to a corrosion potential difference between Cu and Mo being large, a strong galvanic corrosion effect causes an etching rate of Mo to accelerate. Since a tiny gap is formed at an interface between Cu and Mo, a hollow structure as shown by the dotted box in FIG. 1 is formed at the interface between Cu and Mo after infiltration of an etching solution. The hollow structure at the bottom of Cu includes a tip at an edge of a metal film, which is very likely to discharge, causing the display panel to have defective wires or a black screen during a lighting test.

As mentioned above, in the current display panel, the bottom of the metal film is hollowed out due to a large corrosion potential difference between different metal film layers in the metal stack structure, which cause problems such as defective wires or black screen. Therefore, it is necessary to provide a display panel and an electronic device to solve these problems.

SUMMARY OF THE INVENTION

An embodiment of the present application provides a display panel, including: a substrate; and a first metal layer disposed on the substrate; wherein the first metal layer includes a barrier layer and a main body layer arranged in a stack, the main body layer is disposed on a side of the barrier layer away from the substrate, and wherein a corrosion potential difference between the main body layer and the barrier layer is greater than or equal to −0.1V and less than or equal to 0.3V.

According to an embodiment of the present application, the display panel further includes a gate insulating layer and a second metal layer, wherein the gate insulating layer is disposed between the first metal layer and the second metal layer, the first metal layer includes a gate, and the second metal layer includes a source and a drain; and wherein at least one of the first metal layer or the second metal layer is a composite metal layer.

According to an embodiment of the present application, a material of the main body layer is copper, and a material of the barrier layer is a magnesium-aluminum alloy.

According to an embodiment of the present application, a ratio of a mass percentage of magnesium to a mass percentage of aluminum in the barrier layer is greater than or equal to ⅛ and less than or equal to 1.

According to an embodiment of the present application, a thickness of the barrier layer is smaller than a thickness of the body layer.

According to an embodiment of the present application, the thickness of the barrier layer is greater than or equal to 300 angstroms and less than or equal to 500 angstroms.

According to an embodiment of the present application, the thickness of the main body layer is greater than or equal to 2000 angstroms and less than or equal to 8000 angstroms.

According to an embodiment of the present application, an edge of the barrier layer is flush with an edge of the main body layer; or an edge of the barrier layer extends beyond an edge of the main body layer.

According to an embodiment of the present application, the main body layer and the barrier layer include an inclined surface, and an orthographic projection of the main body layer on the substrate falls within an orthographic projection of the barrier layer on the substrate.

An embodiment of the present application further provides an electronic device. The electronic device includes a device body and a display panel mounted on the device body, and the display panel includes: a substrate; and a first metal layer disposed on the substrate; wherein the first metal layer includes a barrier layer and a main body layer arranged in a stack, the main body layer is disposed on a side of the barrier layer away from the substrate, and wherein a corrosion potential difference between the main body layer and the barrier layer is greater than or equal to −0.1V and less than or equal to 0.3V.

According to an embodiment of the present application, the display panel further includes a gate insulating layer and a second metal layer, wherein the gate insulating layer is disposed between the first metal layer and the second metal layer, the first metal layer includes a gate, and the second metal layer includes a source and a drain; and wherein at least one of the first metal layer or the second metal layer is a composite metal layer.

According to an embodiment of the present application, the first metal layer and the second metal layer are composite metal layers.

According to an embodiment of the present application, a material of the main body layer is copper, and a material of the barrier layer is a magnesium-aluminum alloy.

According to an embodiment of the present application, a ratio of a mass percentage of magnesium to a mass percentage of aluminum in the barrier layer is greater than or equal to ⅛ and less than or equal to 1.

According to an embodiment of the present application, a thickness of the barrier layer is smaller than a thickness of the body layer.

According to an embodiment of the present application, the thickness of the barrier layer is greater than or equal to 300 angstroms and less than or equal to 500 angstroms.

According to an embodiment of the present application, the thickness of the main body layer is greater than or equal to 2000 angstroms and less than or equal to 8000 angstroms.

According to an embodiment of the present application, an edge of the barrier layer is flush with an edge of the main body layer.

According to an embodiment of the present application, an edge of the barrier layer extends beyond an edge of the main body layer.

According to an embodiment of the present application, both the main body layer and the barrier layer include an inclined surface, and an orthographic projection of the main body layer on the substrate falls within an orthographic projection of the barrier layer on the substrate.

Embodiments of the present application provide a display panel and an electronic device. The electronic device includes the display panel, wherein the display panel includes a substrate and a composite metal layer disposed on the substrate. The composite metal layer includes a barrier layer and a main body layer arranged in a stack, wherein the main body layer is disposed on a side of the barrier layer away from the substrate. By controlling the corrosion potential difference between the main body layer and the barrier layer between −0.1V and 0.3V to reduce the potential difference between the main body layer and the barrier layer in the composite metal layer. In this way, the etching rate and the etching degree of the barrier layer can be reduced so the gap between the main layer and the barrier layer can be reduced. This solves the problem that the barrier layer in the composite metal layer is hollowed out, thereby preventing the problem of defective lines or black screen in the display panel, and improving the yield of the display panel.

BRIEF DESCRIPTION OF THE SEVERAL VIEWS OF THE DRAWINGS

In order to illustrate the technical solutions in the embodiments or prior art more clearly, the following briefly introduces the accompanying drawings that need to be used in the description of the embodiments or in the prior art. These drawings in the following description are only some disclosed embodiments, and for one skill in the art, other drawings can also be obtained from these drawings without paying creative efforts.

DESCRIPTION OF SPECIFIC EMBODIMENTS OF THE INVENTION

Figure 1:
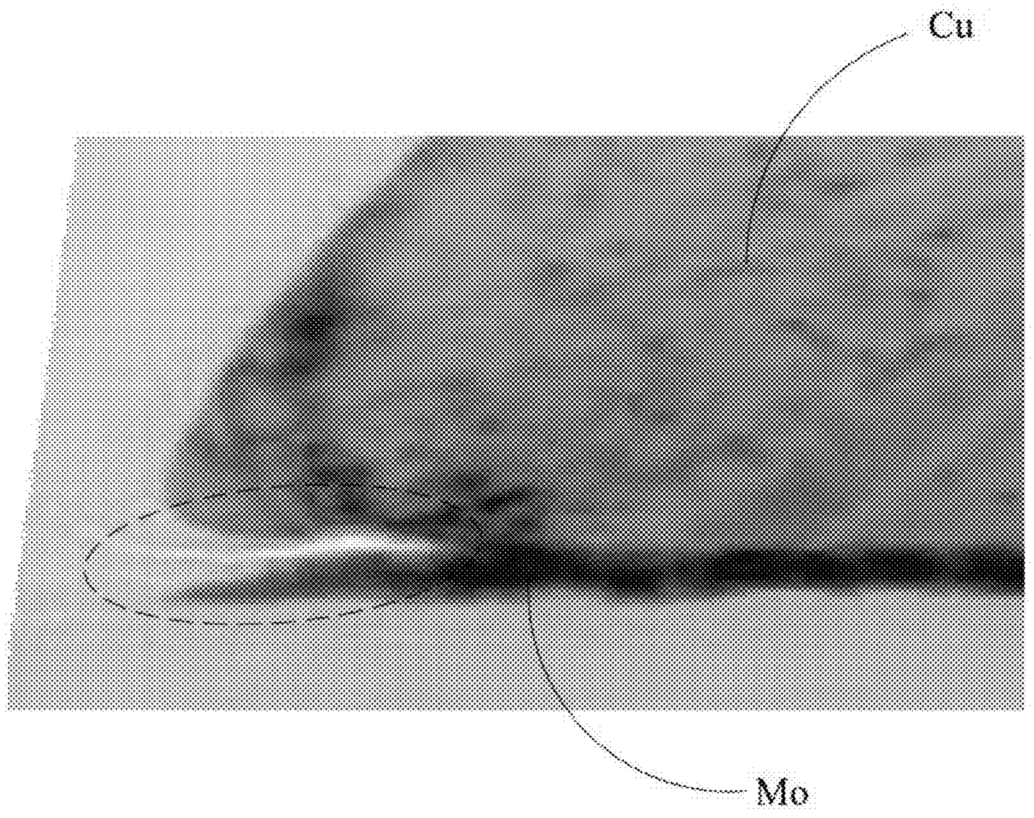
FIG. 1 (prior art)
FIG. 1 is a schematic diagram of a hollow structure formed at an interface of a metal stack structure in a conventional display panel.

The following descriptions of the embodiments refer to the accompanying drawings to illustrate specific embodiments in which the present disclosure may be practiced. The directional terms mentioned in the present disclosure, such as "upper", "lower", "front", "rear", "left", "right", "inner", "outer", and "side" etc., only refer to the orientation of the attached drawings. Accordingly, the directional terms are used to describe and understand the present disclosure, rather than to limit the present disclosure. In the figures, structurally similar elements are denoted by the same reference numerals.

Figure 2:
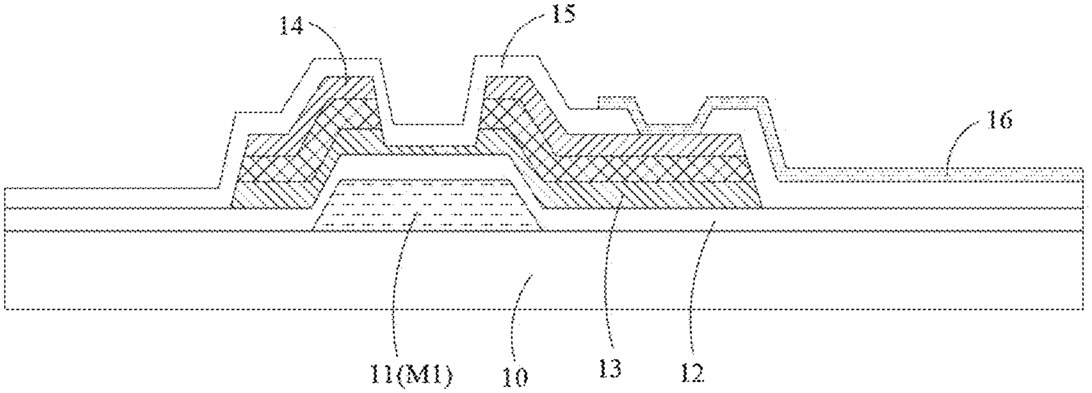
FIG. 2 (prior art)
FIG. 2 is a schematic structural diagram of a current display panel.

The present disclosure will be further described below with reference to the accompanying drawings and specific embodiments:

As shown in FIG. 2, which is a schematic structural diagram of a conventional display panel. The display panel generally includes a glass substrate 10, a plurality of thin film transistors disposed on the glass substrate, and pixel electrodes 16 connected to the thin film transistors. The structure of the thin film transistor from bottom to top is a gate 11, a silicon nitride insulating layer 12, a semiconductor layer 13, a source and drain layer 14, and an insulating layer 15.

Figure 3:
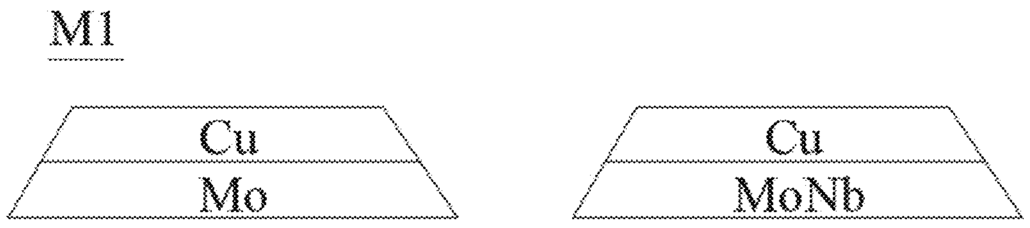
FIG.3 (prior art)
FIG. 3 is a schematic structural diagram of a first metal layer of a conventional display panel.

As shown in FIG. 3, which is a schematic structural diagram of a first metal layer of a conventional display panel. The gate 11 is usually disposed on the first metal layer M1, and the first metal layer M1 usually adopts a Cu/Mo or Cu/MoNb stacked structure, and the Mo or MoNb film layer is located under the Cu film layer.

When the Cu/Mo laminated metal is subjected to cupric acid etching, due to the large corrosion potential difference between Cu and Mo, a strong galvanic corrosion effect is generated, which increases the etching rate of Mo. As a result, a tiny gap is formed at the interface of the film layer of Cu and Mo. After the etching solution infiltrates, a hollow structure as shown by the dotted box in FIG. 1 is formed at the interface of Cu and Mo, that is, the copper loss (Cu loss). The occurrence of Cu loss will form a tip at the edge of the first metal layer M1, and this tip is very likely to discharge, resulting in defective lines or black screen problems during the lighting test of the display panel.

Figure 4:
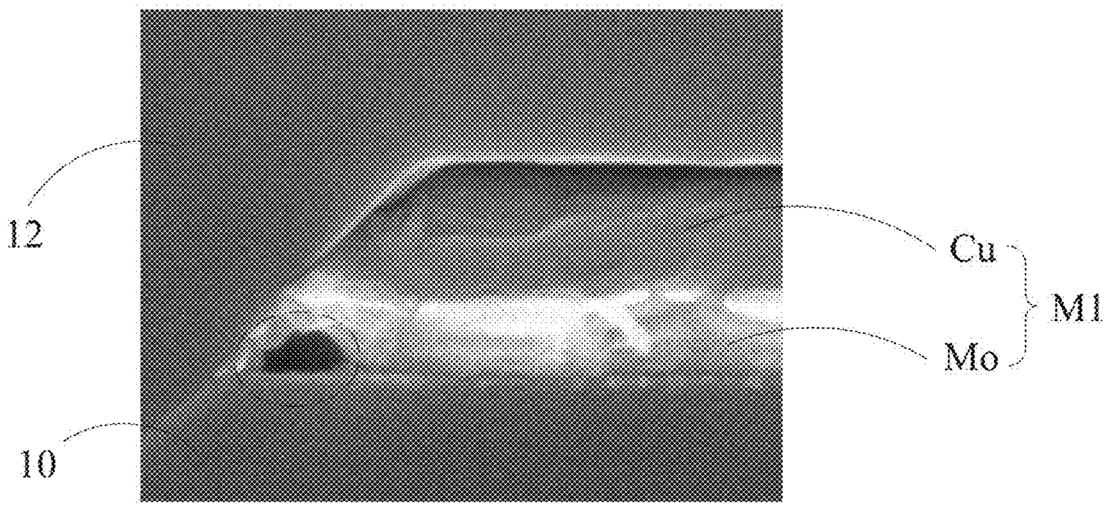
FIG. 4 (prior art)
FIG. 4 is a cross-sectional view of a bottom notch of a first metal layer of a conventional display panel.
Figure 5:
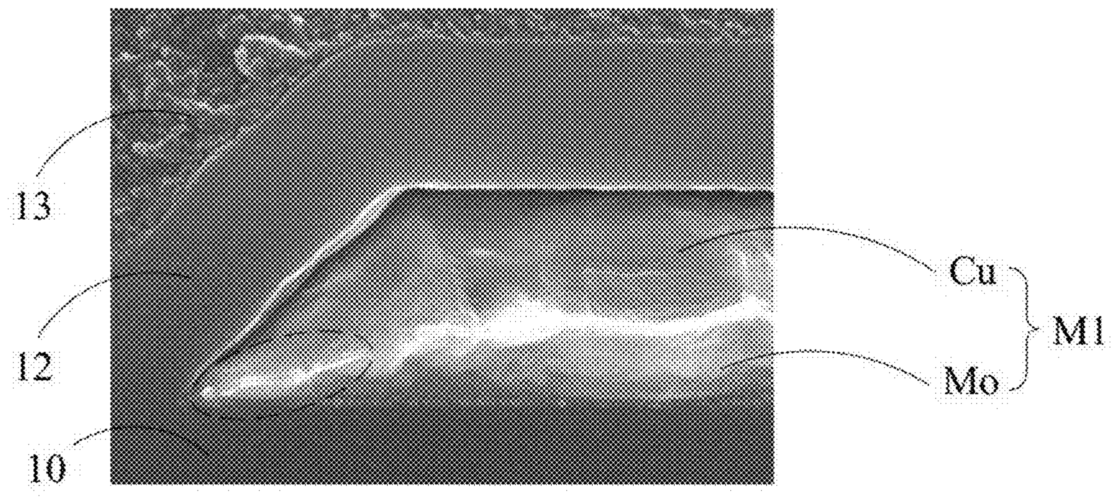
FIG. 5 (prior art)
FIG. 5 is a cross-sectional view of a conventional display panel with a slight trailing at a bottom of the first metal layer.
Figure 6:
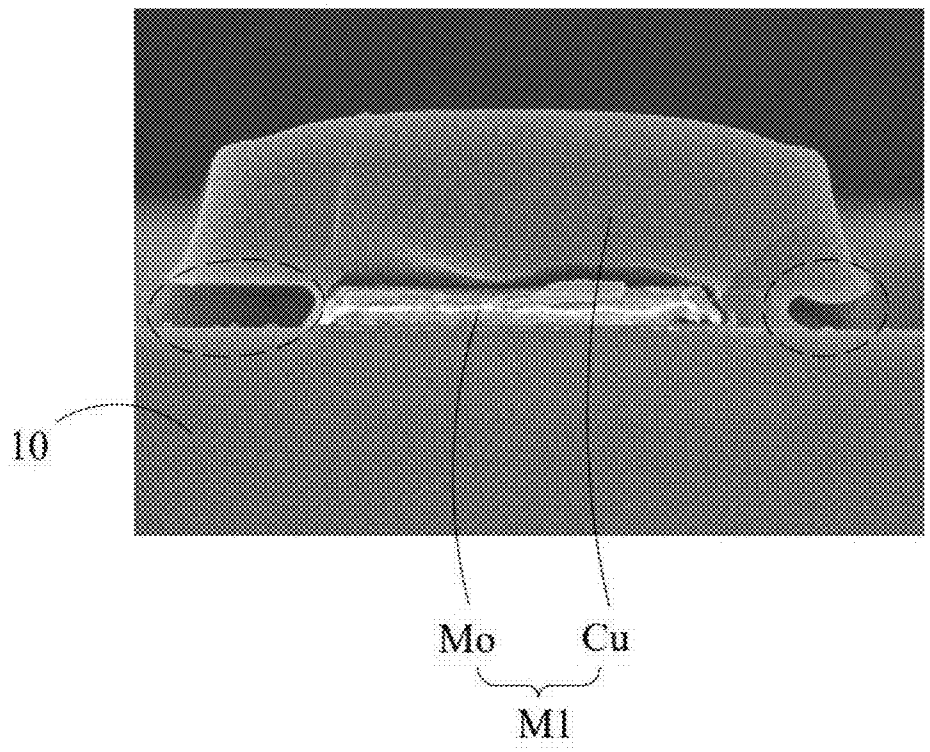
FIG. 6 (prior art)
FIG. 6 is a cross-sectional view of a relatively serious hollowing out of a first metal layer of a conventional display panel.

Cu loss is observed by slicing sampling after etching the first metal layer M1, removing the photoresist (stripper), and depositing to form the silicon nitride insulating layer 12 and the semiconductor layer 13. When observing the cross-section under a scanning electron microscope (SEM), the barrier layer (Mo) at the bottom of the first metal layer M1 has an obvious gap as shown by the dotted box in FIG. 4. Under normal circumstances, it is a complete slope or there is a slight tail at the bottom of the first metal layer M1 as shown by the dotted box in FIG. 5. After etching, the more serious hollowing can be observed with the scanning electron microscope, as shown in the dotted frame of the cross-sectional view in FIG. 6.

An embodiment of the present application provides a display panel, which includes a substrate 21 and a composite metal layer disposed on the substrate 21. The composite metal layer includes a barrier layer and a main body layer arranged in a stack. The main body layer is disposed on the side of the barrier layer away from the substrate 21, and the corrosion potential difference between the main body layer and the barrier layer is greater than or equal to −0.1V and less than or equal to 0.3V. In this way, by reducing the corrosion potential difference between the main layer and the barrier layer, the etching rate of the barrier layer is reduced, so that the etching degree of the barrier layer can be reduced. Further, the gap between the main body layer and the barrier layer is reduced, the problem of hollowing out the barrier layer in the composite metal layer is alleviated, and the problem of defective lines or black screen of the display panel is prevented. Therefore, the yield of the display panel is improved.

Further, the display panel further includes a first metal layer 22, a gate insulating layer 23, and a second metal layer 24, where the gate insulating layer 23 is disposed between the first metal layer 22 and the second metal layer 24. The first metal layer 22 includes a gate 220, the second metal layer 24 includes a source 241 and a drain 242, and at least one of the first metal layer 22 and the second metal layer 24 is composite metal layer.

Figure 7:
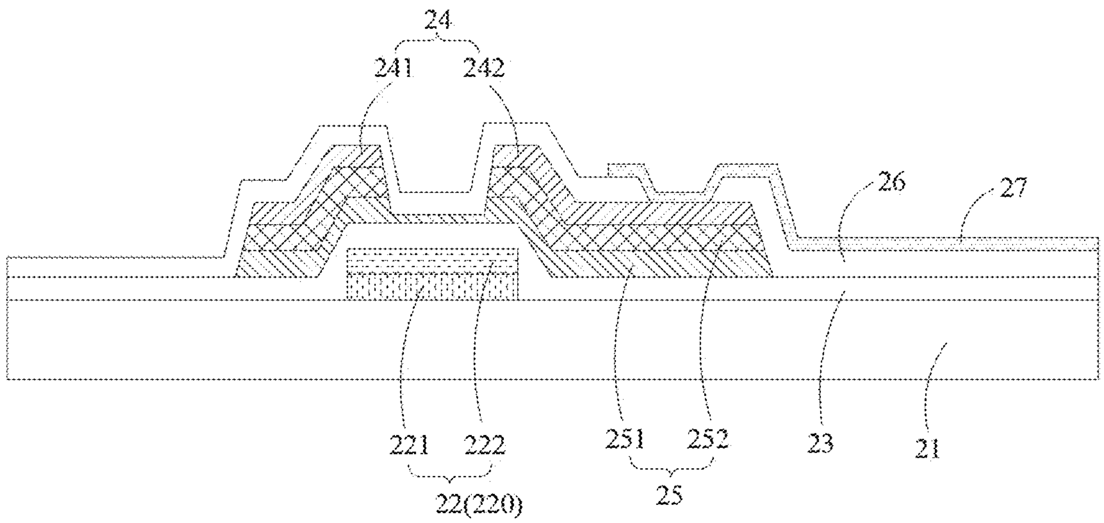
FIG. 7 is a schematic structural diagram of a first display panel provided by an embodiment of the present application.

As shown in FIG. 7, which is a schematic structural diagram of a first display panel provided by an embodiment of the application. The display panel includes a substrate 21, a first metal layer 22 disposed on the substrate 21, a gate insulating layer 23 disposed on the substrate 21 and covering the first metal layer 22, and a second metal layer 24 disposed on a side of the gate insulating layer 23 away from the first metal layer 22. The first metal layer 22 includes a patterned gate, and the second metal layer 24 includes a patterned source 241 and a drain 242.

The display panel further includes a semiconductor layer 25, a first insulating layer 26, and a pixel electrode 27, where the semiconductor layer 25 is disposed between the gate insulating layer 23 and the second metal layer 24. The semiconductor layer 25 includes a channel layer 251 and ohmic contact layers 252 disposed on both sides above the channel layer 251 and spaced apart from each other. The source 241 and the drain 242 are respectively connected to the ohmic contact layer 252, and the pixel electrode 27 is connected to the drain 242.

The display panel includes a plurality of thin film transistors arranged on the substrate 21 and distributed in an array. The gate, the semiconductor layer 25, and the source 241 and drain 242 constitute the thin film transistor.

In the embodiment shown in FIG. 7, the first metal layer 22 is a composite metal layer, where the first metal layer 22 includes a barrier layer 221 and a main body layer 222. The barrier layer 221 is disposed on the substrate 21, and the body layer 222 is disposed on a side of the barrier layer 221 away from the substrate 21.

The material of the barrier layer 221 is magnesium aluminum alloy (MgAl), and the material of the main body layer 222 is copper (Cu). The potential difference between the main body layer 222 and the barrier layer 221 in the first metal layer 22 can be reduced by utilizing the weak electrochemical corrosion effect between the magnesium-aluminum alloy and copper. In this way, the etching rate of the barrier layer 221 is reduced, thereby reducing the etching degree of the blocking layer 221. Further, the gap between the main body layer 222 and the barrier layer 221 is reduced, thereby solving the problem that the barrier layer 221 in the first metal layer 22 is hollowed out.

On the one hand, the barrier layer 221 can be used to improve the adhesion between the barrier layer 221 and the substrate 21, and on the other hand, it can be used to prevent the copper in the main body layer 222 from diffusing to other film layers.

In the embodiment of the present application, the corrosion potential difference between the main body layer 222 and the barrier layer 221 is greater than or equal to −0.1V and less than or equal to 0.3V. For example, the corrosion potential difference between the main body layer 222 and the barrier layer 221 can be −0.1V, 0V, 0.1V, 0.2V, or 0.3V, or the like.

The material of the main body layer 222 is copper, and the metal standard reduction potential of copper is 0.34V. The magnitude of the corrosion potential difference between the main body layer 222 and the barrier layer 221 depends on the content of magnesium and aluminum in the barrier layer 221 and the thickness of the main body layer 222 and the barrier layer 221.

Further, the mass percentage of magnesium in the barrier layer 221 is less than or equal to the mass percentage of aluminum. The standard electrode potential of magnesium is −2.37V, which is about 0.7V lower than that of aluminum. If the content of magnesium in the barrier layer 221 exceeds the content of aluminum, the corrosion potential of the barrier layer 221 will be lowered, and the corrosion potential difference between the main body layer 222 and the barrier layer 221 will be increased, which will lead to more serious hollowing out of the barrier layer 221. By limiting the mass percentage of magnesium in the barrier layer 221 to be less than or equal to the mass percentage of aluminum, the corrosion potential difference between the barrier layer 221 and the bulk layer 222 can be reduced. In this way, the electrochemical corrosion effect between the main body layer 222 and the barrier layer 221 is weakened, so that the problem of hollowing out the barrier layer in the first metal layer 22 can be alleviated.

The ratio of the mass percentage of magnesium to the mass percentage of aluminum in the barrier layer 221 is greater than or equal to ⅛ and less than or equal to 1. It can be understood that if the mass percentage of magnesium is too large or too small, the reduction potential of the barrier layer 221 will be too large, and the corrosion potential of the barrier layer 221 will be deviated. This will lead to metal chemical corrosion of the copper in the main layer 222 and the magnesium-aluminum alloy in the barrier layer 221, so that the hollowing out of the metal stack structure cannot be solved.

In one embodiment, the ratio of the mass percentage of magnesium to the mass percentage of aluminum in the barrier layer 221 may be 1:8, 1:4, 2:3, 1:1, or the like.

Further, the thickness of the barrier layer 221 is smaller than the thickness of the main body layer 222.

In one embodiment, the thickness of the barrier layer 221 can be 300 angstroms, 350 angstroms, 400 angstroms, 450 angstroms, or 500 angstroms, that is, it only needs to be greater than or equal to 300 angstroms and less than or equal to 500 angstroms. If the thickness of the barrier layer 221 is less than 300 angstroms, the diffusion of copper in the main body layer 222 cannot be blocked, and the effect of reducing Cu loss cannot be achieved. In practical applications, if the production cost is not considered, the thickness of the barrier layer 221 may also be greater than 500 angstroms, which is not limited herein.

The thickness of the main body layer 222 may be 2000 angstroms, 3000 angstroms, 4000 angstroms, 5000 angstroms, 6000 angstroms, 7000 angstroms or 8000 angstroms, that is, it only needs to be greater than or equal to 2000 angstroms and less than or equal to 8000 angstroms.

Further, the edge of the barrier layer 221 is flush with the edge of the main body layer 222. In the thickness direction of the display panel, the orthographic projection of the barrier layer 221 on the substrate 21 overlaps with the orthographic projection of the main body layer 222 on the substrate 21.

In one embodiment, the edge of the barrier layer 221 may also extend beyond the edge of the main body layer 222.

Figure 8:
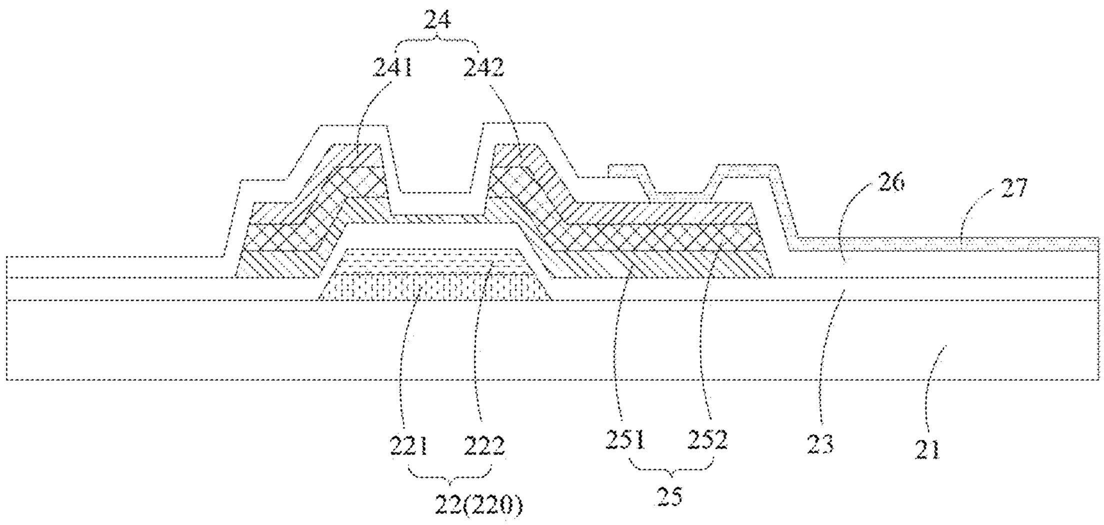
FIG. 8 is a schematic structural diagram of a second display panel provided by an embodiment of the present application.

As shown in FIG. 8, which is a schematic structural diagram of a second display panel provided by an embodiment of the present application, and its structure is substantially the same as that of the first display panel shown in FIG.

7. The difference is that the edge of the barrier layer 221 is beyond the edge of the main body layer 222, and both the main body layer 222 and the barrier layer 221 have inclined surfaces. In the thickness direction of the display panel, the orthographic projection of the main body layer 222 on the substrate 21 falls within the orthographic projection of the barrier layer 221 on the substrate 21.

Figure 9:
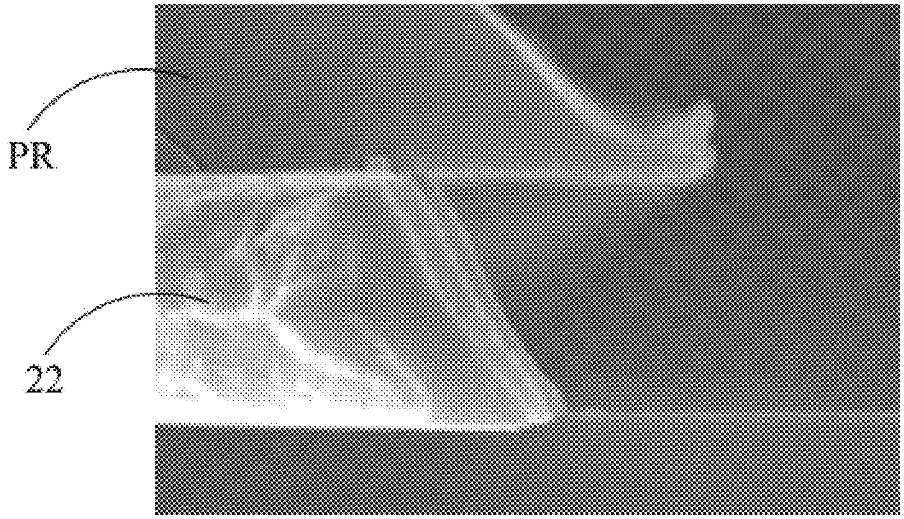
FIG. 9 is a cross-sectional view of the first metal layer provided in the embodiment of the present application after being etched.

In the process of forming the first metal layer 22, a layer of magnesium-aluminum alloy may be deposited on the substrate 21 to form a magnesium-aluminum alloy film layer. Then a layer of copper material is deposited on the magnesium-aluminum alloy film layer to form a copper film layer, and then a photoresist is coated on the first metal layer 22 and an exposure procedure is performed, so that part of the metal film layer is covered by the photoresist and cannot be etched. Finally, using hydrogen peroxide-based cupric acid to etch the first metal layer 22, so that the part not covered by the photoresist is completely etched as shown in FIG. 9. The first metal layer under the photoresist is clearly visible in the scanning electron microscope picture shown in FIG. 9, which has an inclined surface.

Figure 10:
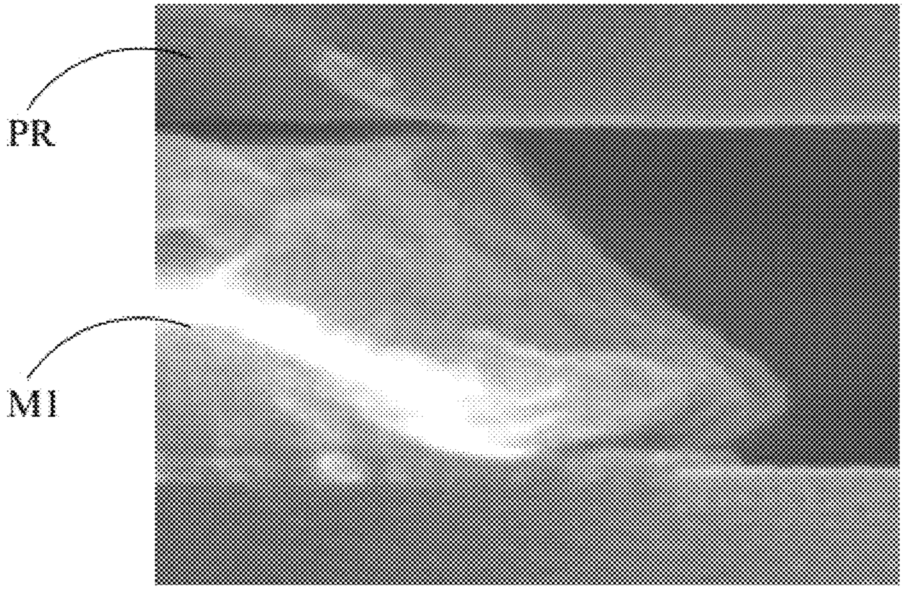
FIG. 10 (prior art)
FIG. 10 is a cross-sectional view of a first metal layer of a conventional display panel after being etched.

The first metal layer M1 of the prior art shown in FIG. 2 and FIG. 3 is etched using the same hydrogen peroxide-based cupric acid, so that the part not covered by the photoresist is completely etched as shown in FIG. 10. In the scanning electron microscope photograph shown in FIG. 10, Cu loss phenomenon exists at the bottom of the first metal layer M1.

In the embodiment shown in FIG. 7, the second metal layer 24 may be a single-layer metal film layer, it can also be a composite metal layer with at least two metal layers superimposed, and the structure and material of the composite metal layer can be the same as or different from the structure and material of the first metal layer 22. For example, the material of the second metal layer 24 may be any one of metal materials such as copper, aluminum, or silver, or an alloy of the metal materials.

Figure 11:
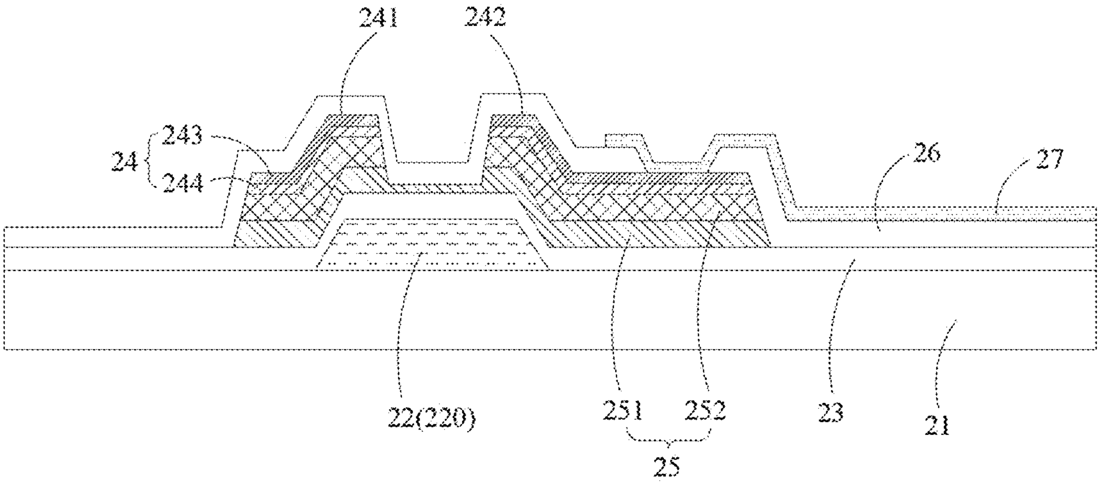
FIG. 11 is a schematic structural diagram of a third display panel according to an embodiment of the present application.

In one of the embodiments, as shown in FIG. 11, which is a schematic structural diagram of a third display panel provided by an embodiment of the present application. Its structure is substantially the same as that of the second display panel shown in FIG. 8, except that the first metal layer 22 is a single-layer metal structure, and the second metal layer 24 is a composite metal layer.

The material of the first metal layer 22 may be any one of metal materials such as copper, aluminum, or silver, or an alloy of multiple materials.

The second metal layer 24 may include a main body layer 243 and a barrier layer 244. The material and structure of the main body layer 243 may be the same as those of the main body layer 222 in the first display panel shown in FIG. 7 or FIG. 8. The material and structure of the barrier layer 244 in the second metal layer 24 may be the same as the material and structure of the barrier layer 221 in the first display panel shown in FIG. 7 or FIG. 8. It is not repeated herein.

Figure 12:
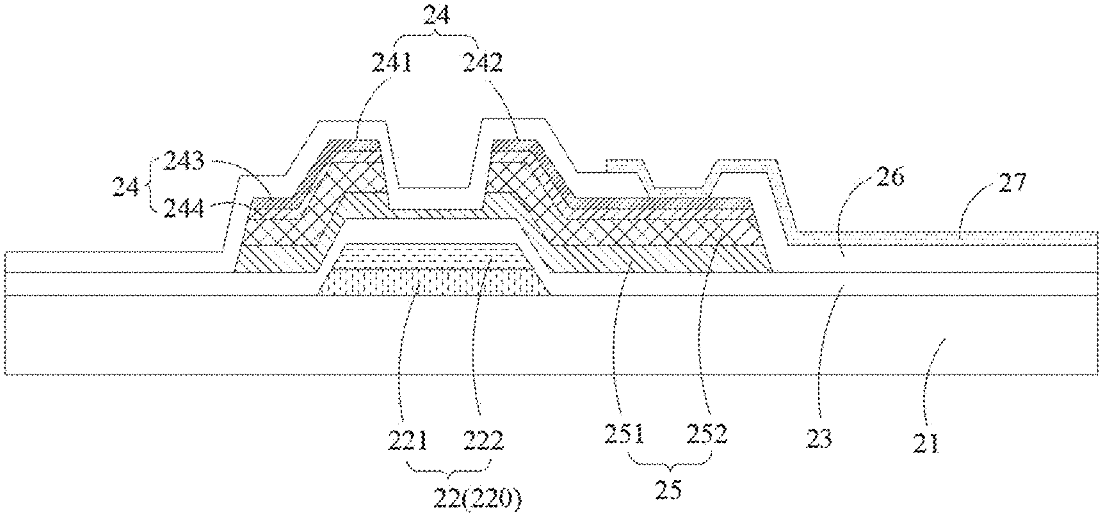
FIG. 12 is a schematic structural diagram of a fourth display panel according to an embodiment of the present application.

In one of the embodiments, as shown in FIG. 12, which is a schematic structural diagram of a fourth display panel provided by an embodiment of the present application, and its structure is substantially the same as that of the second display panel shown in FIG. 8. The difference is that the first metal layer 22 and the second metal layer 24 are both composite metal layers. The first metal layer 22 may include a first barrier layer 221 and a first body layer 222, and the second metal layer 24 may include a second barrier layer 243 and a second body layer 244. The materials of the first barrier layer 221 and the second barrier layer 243 are both magnesium-aluminum alloys, and the materials of the first body layer 222 and the second body layer 244 are both copper.

It should be noted that the display panel in the embodiment of the present application includes two metal layers, which are the first metal layer 22 and the second metal layer 24 respectively. In practical applications, the display panel may include three or more metal layers, and the metal layers may be the composite metal layers as described in the embodiments of the present application.

Figure 13:
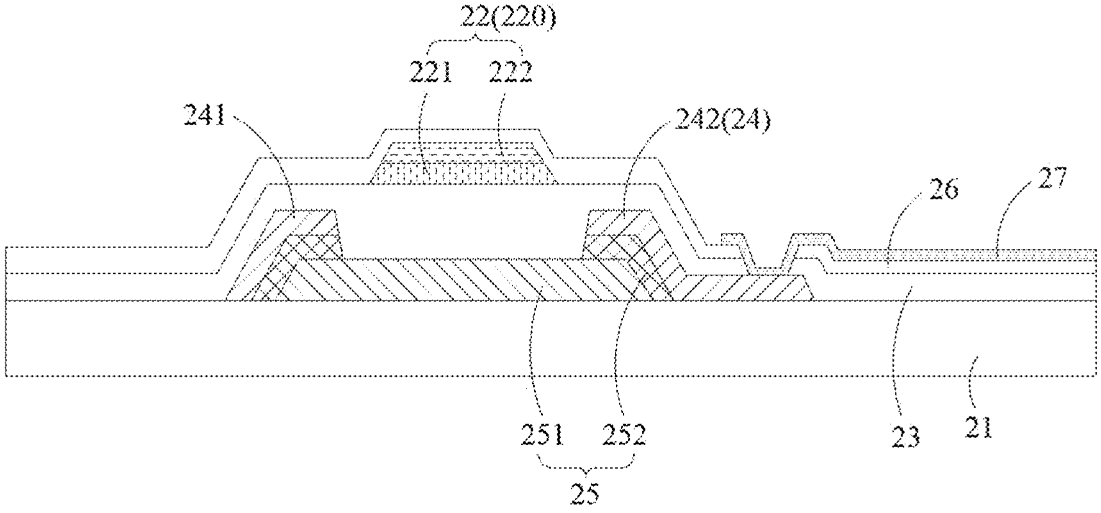
FIG. 13 is a schematic structural diagram of a fifth display panel according to an embodiment of the present application.

It should be noted that, the thin film transistor in the display panel provided by the embodiment of the present application is not limited to a bottom gate structure, but may also be a top gate structure. As shown in FIG. 13, which is a schematic structural diagram of a fifth display panel provided by an embodiment of the application, and its structure is substantially the same as that of the second display panel shown in FIG. 8, with the following differences: The semiconductor layer 25 is disposed on the substrate 21, the second metal layer 24 is disposed on the semiconductor layer 25, the gate insulating layer 23 is disposed on the side of the second metal layer 24 away from the substrate 11, the first metal layer 22 is disposed on a side of the gate insulating layer 23 away from the second metal layer 24, the first insulating layer 26 is disposed on a side of the first metal layer 22 away from the gate insulating layer 23, and the pixel electrode 27 is disposed on the first insulating layer 26.

In the embodiment shown in FIG. 13, the first metal layer 22 is a composite metal layer, and the first metal layer 22 may include a barrier layer 221 and a body layer 222. The barrier layer 221 is disposed on the gate insulating layer 23, and the body layer 222 is disposed on a side of the barrier layer 221 away from the gate insulating layer 23.

The second metal layer 24 may be a composite metal layer with the same structure and material as the first metal layer 22, or may be another composite metal layer or a single-layer metal layer different from the material or structure of the first metal layer 22, which is not limited herein.

According to the display panel provided by the embodiments of the present application, an embodiment of the present application further provides an electronic device. The electronic device includes a device body and the display panel provided in the above-mentioned embodiments, where the display panel is mounted on the device body. The device body may include parts such as a casing, a power supply, and a circuit board. The electronic device may be a mobile terminal, such as color electronic paper, color e-book, smart phone, or the like. The electronic device may also be a wearable terminal, such as a smart watch, a smart bracelet, or the like. The electronic device may also be a fixed terminal, such as a color electronic billboard, a color electronic poster, or the like.

The advantages of the embodiments of the present application:

Embodiments of the present application provide a display panel and an electronic device. The electronic device includes the display panel, wherein the display panel includes a substrate and a composite metal layer disposed on the substrate. The composite metal layer includes a barrier layer and a main body layer arranged in a stack, wherein the main body layer is disposed on a side of the barrier layer away from the substrate. By controlling the corrosion potential difference between the main body layer and the barrier layer between −0.1V and 0.3V to reduce the potential difference between the main body layer and the barrier layer in the composite metal layer. In this way, the etching rate and the etching degree of the barrier layer can be reduced so the gap between the main layer and the barrier layer can be reduced. This solves the problem that the barrier layer in the composite metal layer is hollowed out, thereby preventing the problem of defective lines or black screen in the display panel, and improving the yield of the display panel.

In conclusion, although the present application discloses the aforesaid preferred embodiments, the aforesaid preferred embodiments are not intended to limit the present application. One ordinary skill in the art can make various changes and modifications without departing from the spirit and scope of the present application. Therefore, the protection scope of the present application is based on the scope defined by the claims.

What is claimed is:

1. A display panel, comprising:

a substrate; and a first metal layer disposed on the substrate;

wherein the first metal layer comprises a barrier layer and a main body layer arranged in a stack, the main body layer is disposed on a side of the barrier layer away from the substrate, and wherein a corrosion potential difference between the main body layer and the barrier layer is greater than or equal to −0.1V and less than or equal to 0.3V, wherein a material of the main body layer comprises copper, and a material of the barrier layer comprises a magnesium-aluminum alloy, wherein a ratio of a mass percentage of magnesium to a mass percentage of aluminum in the barrier layer is greater than or equal to ⅛ and less than or equal to 1.

2. The display panel of claim 1, further comprising a gate insulating layer and a second metal layer disposed on the first metal layer, wherein the gate insulating layer is disposed between the first metal layer and the second metal layer, the first metal layer comprises a gate, and the second metal layer comprises a source and a drain; and wherein at least one of the first metal layer or the second metal layer is a composite metal layer.

3. The display panel of claim 1, wherein a thickness of the barrier layer is smaller than a thickness of the body layer.

4. The display panel of claim 3, wherein the thickness of the barrier layer is greater than or equal to 300 angstroms and less than or equal to 500 angstroms.

5. The display panel of claim 4, wherein the thickness of the main body layer is greater than or equal to 2000 angstroms and less than or equal to 8000 angstroms.

6. The display panel of claim 1, wherein an edge of the barrier layer is flush with an edge of the main body layer; or an edge of the barrier layer extends beyond an edge of the main body layer.

7. The display panel of claim 6, wherein the main body layer and the barrier layer comprise an inclined surface, and an orthographic projection of the main body layer on the substrate falls within an orthographic projection of the barrier layer on the substrate.

8. An electronic device, comprising a device body and a display panel mounted on the device body, wherein the display panel comprises a substrate; and a first metal layer disposed on the substrate;

wherein the first metal layer comprises a barrier layer and a main body layer arranged in a stack, the main body layer is disposed on a side of the barrier layer away from the substrate, and wherein a corrosion potential difference between the main body layer and the barrier layer is greater than or equal to −0.1V and less than or equal to 0.3V, wherein a material of the main body layer comprises copper, and a material of the barrier layer comprises a magnesium-aluminum alloy, wherein a ratio of a mass percentage of magnesium to a mass percentage of aluminum in the barrier layer is greater than or equal to ⅛ and less than or equal to 1.

9. The electronic device of claim 8, wherein the display panel further comprises a gate insulating layer and a second metal layer disposed on the first metal layer, wherein the gate insulating layer is disposed between the first metal layer and the second metal layer, the first metal layer comprises a gate, and the second metal layer comprises a source and a drain; and wherein at least one of the first metal layer or the second metal layer is a composite metal layer.

10. The electronic device of claim 9, wherein the first metal layer and the second metal layer are composite metal layers.

11. The electronic device of claim 8, wherein a thickness of the barrier layer is smaller than a thickness of the body layer.

12. The electronic device of claim 11, wherein the thickness of the barrier layer is greater than or equal to 300 angstroms and less than or equal to 500 angstroms.

13. The electronic device of claim 12, wherein the thickness of the main body layer is greater than or equal to 2000 angstroms and less than or equal to 8000 angstroms.

14. The electronic device of claim 8, wherein an edge of the barrier layer is flush with an edge of the main body layer.

15. The electronic device of claim 8, wherein an edge of the barrier layer extends beyond an edge of the main body layer.

16. The electronic device of claim 15, wherein the main body layer and the barrier layer comprise an inclined surface, and an orthographic projection of the main body layer on the substrate falls within an orthographic projection of the barrier layer on the substrate.

* * * * *